United States Patent
Wood

(10) Patent No.: US 7,365,326 B2
(45) Date of Patent: Apr. 29, 2008

(54) CAMERA HAVING DISTORTION CORRECTION

(75) Inventor: Roland Andrew Wood, Bloomington, MN (US)

(73) Assignee: Honeywell International Inc., Morristown, NJ (US)

( * ) Notice: Subject to any disclaimer, the term of this patent is extended or adjusted under 35 U.S.C. 154(b) by 1106 days.

(21) Appl. No.: 10/346,476

(22) Filed: Jan. 17, 2003

(65) Prior Publication Data

US 2003/0197124 A1 Oct. 23, 2003

(51) Int. Cl.
*G01J 5/02* (2006.01)

(52) U.S. Cl. .................. 250/332; 250/338.1; 250/353; 348/217.1; 382/285

(58) Field of Classification Search ............... 250/332, 250/338.1, 353; 348/217.1; 382/275
See application file for complete search history.

(56) References Cited

U.S. PATENT DOCUMENTS

| | | | |
|---|---|---|---|
| 4,298,887 A | 11/1981 | Rode | |
| 4,302,673 A | 11/1981 | Bly | |
| 4,654,622 A | 3/1987 | Foss et al. | |
| 4,720,738 A | 1/1988 | Simmons | |
| 4,752,694 A | 6/1988 | Hegel et al. | |
| 5,220,188 A | 6/1993 | Higashi et al. | |
| 5,220,189 A | 6/1993 | Higashi et al. | |
| 5,260,225 A | 11/1993 | Liu et al. | |
| 5,286,976 A | 2/1994 | Cole | |
| 5,293,041 A | 3/1994 | Kruse | |
| 5,420,419 A | 5/1995 | Wood | |
| 5,422,475 A | 6/1995 | Norton | |
| 5,449,910 A | 9/1995 | Wood et al. | |
| 5,489,776 A | 2/1996 | Lung | |
| 5,534,111 A | 7/1996 | Hocker et al. | |
| 5,606,365 A | 2/1997 | Maurinus et al. | |
| 5,675,149 A | 10/1997 | Wood et al. | |
| 5,688,699 A | 11/1997 | Cunningham | |
| 5,729,019 A | 3/1998 | Krafthefer et al. | |
| 5,751,863 A * | 5/1998 | Farr ........................... | 382/275 |
| 5,811,808 A | 9/1998 | Cannata | |
| 5,812,309 A | 9/1998 | Thoma et al. | |
| RE36,136 E | 3/1999 | Higashi et al. | |
| 5,880,777 A * | 3/1999 | Savoye et al. ........... | 348/217.1 |
| 5,895,233 A | 4/1999 | Higashi | |
| 5,903,659 A | 5/1999 | Kilgore | |

(Continued)

OTHER PUBLICATIONS

McMichael et al. "Micro Air Vehicles—Toward a New Dimension in Flight" [online], DARPA 1997 [retrieved on Jun. 15, 2005]. Retrieved from the Internet <URL: http://www.fas.org/irp/program/collect/docs/mav_auvsi.htm>.*

(Continued)

*Primary Examiner*—David Porta
*Assistant Examiner*—Shun Lee
(74) *Attorney, Agent, or Firm*—Kris T. Fredrick

(57) ABSTRACT

A lightweight camera is provided that includes a lightweight lens system that has a reduced number of lenses. Reducing the number of lenses produces a lighter camera, but produces a distorted local image. The distorted local image is captured by the lightweight camera, and is preferably transmitted to a remote station. The remote station then performs image processing on the distorted image to remove at least some of the distortion in the image. Preferably, a Massively Parallel Richardson-Lucy (MPRL) algorithm is used to identify and remove distortion from the image. Also, motion, temperature and inter-detector difference distortion is detected and corrected.

6 Claims, 11 Drawing Sheets

U.S. PATENT DOCUMENTS

| | | | |
|---|---|---|---|
| 5,939,971 | A | 8/1999 | Yong |
| 5,999,211 | A | 12/1999 | Hedges et al. |
| 6,011,876 | A | 1/2000 | Kishner |
| 6,023,061 | A | 2/2000 | Bodkin |
| 6,026,337 | A | 2/2000 | Krigbaum et al. |
| 6,031,231 | A | 2/2000 | Kimata |
| RE36,615 | E | 3/2000 | Wood |
| 6,036,872 | A | 3/2000 | Wood et al. |
| 6,046,485 | A | 4/2000 | Cole et al. |
| RE36,706 | E | 5/2000 | Cole |
| 6,097,031 | A | 8/2000 | Cole |
| 6,122,009 | A | 9/2000 | Ueda |
| 6,148,152 | A | 11/2000 | Cazier et al. |
| 6,433,333 | B1* | 8/2002 | Howard ............ 250/252.1 |
| 6,714,240 | B1* | 3/2004 | Caswell ............ 348/241 |

OTHER PUBLICATIONS

U.S. Appl. No. 09/748,795, filed Dec. 26, 2000 "Lightweight Infrared Camera".

U.S. Appl. No. 09/748,784, filed Dec. 26, 2000 "Improved Microbolometer Operating System".

Internet Article: "Image Restoration," ra.stsci.edu/documents/SUG/UG_29.html, Oct. 23, 2000, 6 sheets.

Internet Article: Image Scientist,: www.image-scientist.com/order.htm, Oct. 23, 2000, 1 sheet.

Internet Article: "Lenses," elchem.kaist.ac.kr/vt/chem.-ed/optics/lenses.htm, Oct. 23, 2000, 4 sheets.

Internet Article: "MPRL—Massively Parallel Richardson-Lucy," huey.jpl.nasa.gov/mprl, Oct. 23, 2000, 2 sheets.

Internet Article: "Computer Aided Analysis and Restoration of Images," www.ndt.net/article/v04n12/palles1/palles1.htm, Oct. 23, 2000, 4 sheets.

Trussell, H.J., et al., "Sectioned Methods for Image Restoration," *IEEE Transactions on Acoustics, Speech, and Signal Processing*, vol. ASSP-26, No. 2, Apr. 1978, pp. 157-164.

Trussell, H.J., et al., "Image Restoration of Space-Variant Blurs by Sectioned Methods," *IEEE Transactions on Acoustics, Speech, and Signal Processing*, vol. ASSP-26, No. 6, Dec. 1978, pp. 608-609.

Richardson, William Hadley, "Bayesian-Based Iterative Method of Image Restoration," *Journal of the Optical Society of America*, vol. 62, No. 1, Jan. 1972, pp. 55-59.

Lucy, L.B., An Iterative Technique for the Rectification of Observed Distributions, *The Astronomical Journal*, vol. 79, No. 6, Jun. 1974, pp. 745-754.

Boden, A.F. t al., "Massively Parallel Spatially Variant Maximum-likelihood Restoration of Hubble Space Telescope Imagery," *Journal of the Optical Society of America*, vol. 13, No. 7, Jul. 1996, pp. 1537-1545.

Snyder, Donald L. et al., "Image Recovery From Data Acquired with a Charge-Coupled-Device Camera," *Journal of the Optical Society of America*, vol. 10, No. 5, May 1993, pp. 1014-1023.

Internet Article: "Encyclopedia Britannica, Figure 8: Lens aberrations," www.britannica. com/bcom/eb/article/single_image/0,5716,7073+asmbly_id,00.html, Oct. 23, 2000, 1 sheet.

J. Krist, R. Hook, "The Tiny Tim User's Guide", Version 5.0, Nov. 1999, found at http://www.stsci.edu/software/tinytim, 29 pages.

\* cited by examiner

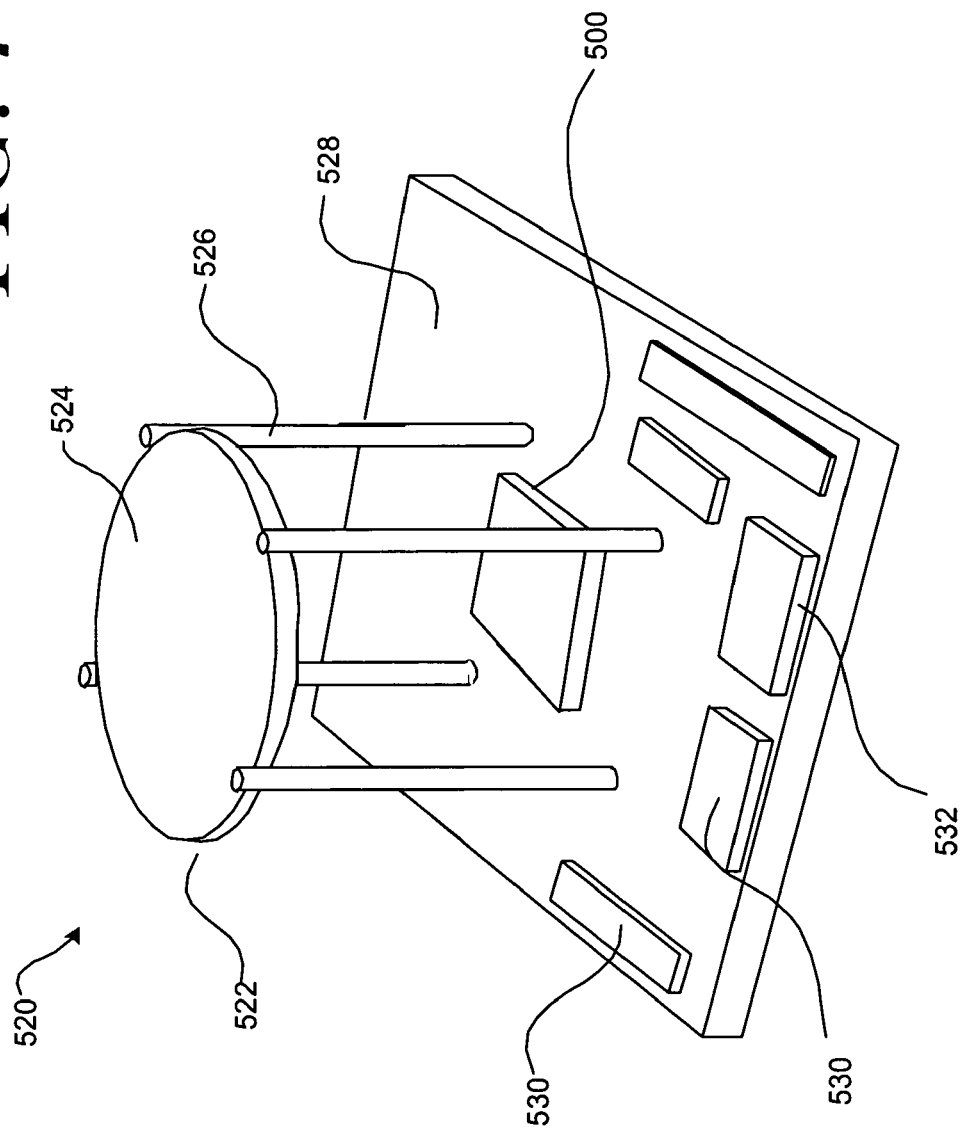

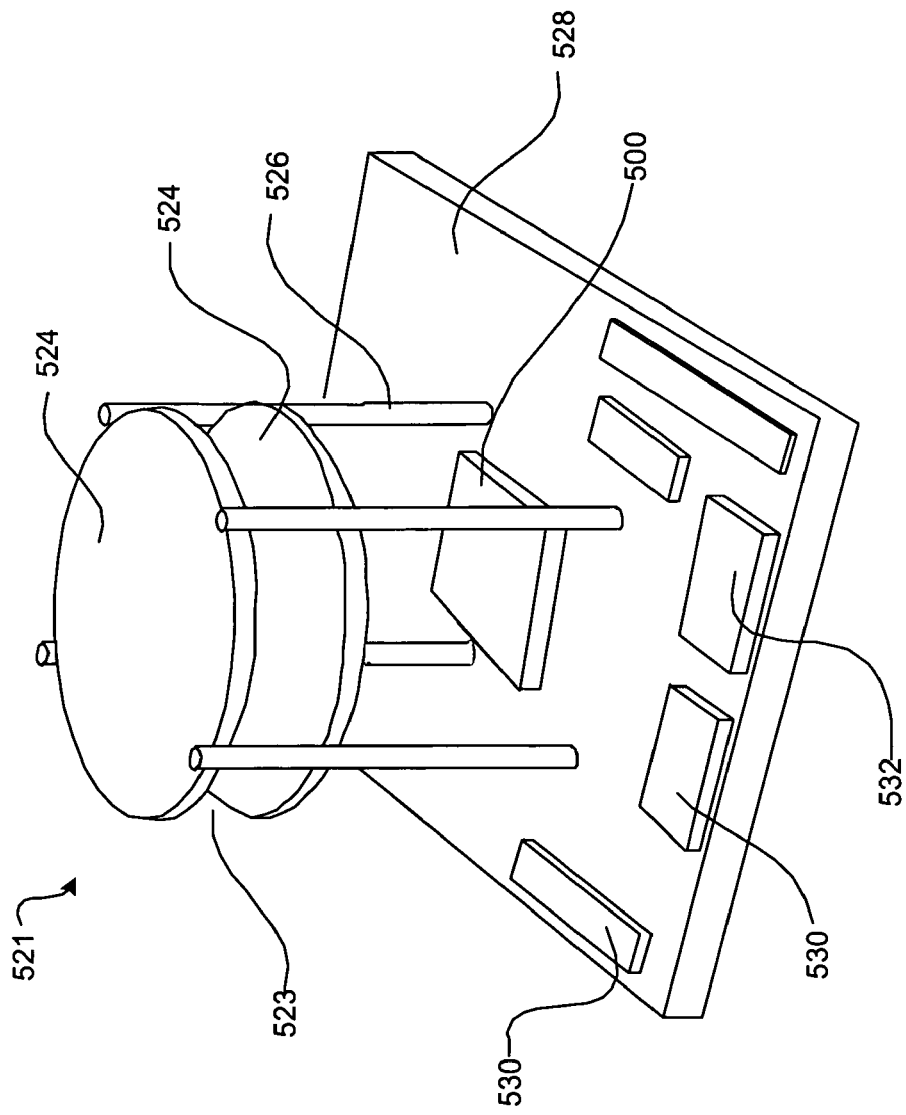

CAMERA HAVING DISTORTION CORRECTION

The present application is related to U.S. patent application Ser. No. 09/748,795, filed Dec. 26, 2000, entitled "LIGHTWEIGHT INFRARED CAMERA", now U.S. Pat. No. 6,559,447, and U.S. patent application Ser. No. 09/748,784, filed Dec. 26, 2000, entitled "MICROBOLOMETER OPERATING SYSTEM", now U.S. Pat. No. 6,541,772, which are herein incorporated by reference.

BACKGROUND

The present invention relates generally to infrared (IR) cameras and detectors. More particularly, the present invention relates to a lens system and method for use with a lightweight infrared (IR) camera.

Infrared cameras and sensors in general, and microbolometer cameras in particular, are well known to those skilled in the art. See, for example, U.S. Pat. Nos. 5,688,699; 5,999,211; 5,420,419; and 6,026,337, all of which are incorporated herein by reference. Infrared microbolometer cameras typically include an array of infrared sensitive sensing detectors, each having a resistance that changes with temperature, with each detector having an infrared absorber that may be formed in several ways. See, for example, U.S. Pat. Nos. 5,939,971 and 5,729,019, herein incorporated by reference.

During operation, the incoming infrared radiation heats each sensing detector in proportion to the amount of infrared radiation received. The sensing detectors are then queried, typically one by one, to determine the resistance of the sensing detectors, and thus the amount of infrared radiation received. Typically, supporting electronics are provided with the camera to process the detector output signals, provide calibration and compensation, and provide a resulting image.

Because heat is used to measure the amount of incoming infrared energy, changes in the ambient temperature of the microbolometer array can significantly affect the detector signals. To compensate for this, many infrared cameras or detectors have a thermoelectric stabilizer to regulate the temperature of the array. In one example, thermoelectric stabilizers are used to maintain the array temperature at a known value. A limitation of using thermoelectric stabilizers is that they can draw significant power and can add significant weight to the system.

Because of manufacturing tolerances, each sensing detector in the camera or detector may have a slightly different zero point than other detectors within the system. To compensate for these detector-to-detector differences, many infrared cameras or detectors have a means for providing a zero radiation baseline value, which is made available to interpret or calibrate the detector output signals. One method for providing the zero radiation baseline is to use a shutter or chopper to periodically block the incoming infrared energy. When the shutter or chopper is activated, a zero radiation baseline is read and stored. A limitation of this approach is that the shutter or chopper can add significant complexity and weight to the system, which for some applications, can be particularly problematic. Another approach for providing a zero radiation baseline is to periodically point the camera at a uniform infrared source such as the sky. This, however, can require significant control circuitry to periodically change the direction of the camera, again adding weight to the system.

Typically, a lens system is used to focus the incoming infrared radiation on the sensing detectors. The lens system often includes a triplet of lenses. The first lens typically forms an image having significant distortion, such as spherical aberration. The focal plane of the first lens often is a focal surface which is curved, and produces a distorted image if provided directly to a planar detector array. The distorted image is often corrected by one or more correcting lenses. The correcting lenses can be used to produce a useable image, but add significant weight to the infrared camera.

For some applications, the weight of the infrared camera can be important. For example, for lightweight micro air vehicle (MAV) applications, the weight of the infrared camera can impact the size, range and other critical performance parameters of the vehicle. As such, a lightweight infrared camera having a lightweight lens system would be highly desirable.

SUMMARY

The present invention overcomes many disadvantages of the prior art by providing a lightweight infrared camera that uses a lightweight lens system. This is preferably accomplished by eliminating one or more of the correcting lenses, and sensing the distorted or uncorrected image. Once sensed, the uncorrected image is preferably transmitted to a remote station. The remote station preferably includes an algorithm for performing the necessary calibration and/or compensation to produce a corrected or desired image.

One illustrative embodiment of the present invention uses a single element germanium lens. Image correction, which is provided by one or more correcting lenses in the prior art, can be eliminated or reduced. A distorted or uncorrected image is captured and transmitted to a remote station. The remote station then performs any calibration and compensation necessary to produce a corrected or desired image.

The distorted image may be processed by an image processor, which in a preferred embodiment, executes a maximum likelihood estimation algorithm. One such algorithm is a Richardson-Lucy algorithm, or more preferably a massively parallel Richardson-Lucy algorithm. The image processor may be primarily or totally a general purpose computer executing image processing software algorithms.

In one illustrative embodiment, a singlet germanium lens is spaced off a ceramic motherboard by titanium legs. The lens is used to focus IR radiation onto an integrated vacuum package that encloses a microbolometer array. One use of the invention is as a lightweight, infrared camera disposed on a micro air vehicle (MAV). The reduced number of lenses may reduce the weight of the remote camera, which may increase the performance or other characteristics of a MAV vehicle.

BRIEF DESCRIPTION OF THE DRAWINGS

FIGS. 7 and 7a are perspective views of a camera system including a singlet lens spaced off an integral vacuum package as in FIG. 6 by a support;

FIGS. 8 and 8a are perspective views of a camera system including a doublet lens spaced off an integral vacuum package as in FIG. 6 by a support.

DESCRIPTION

Figure 1:
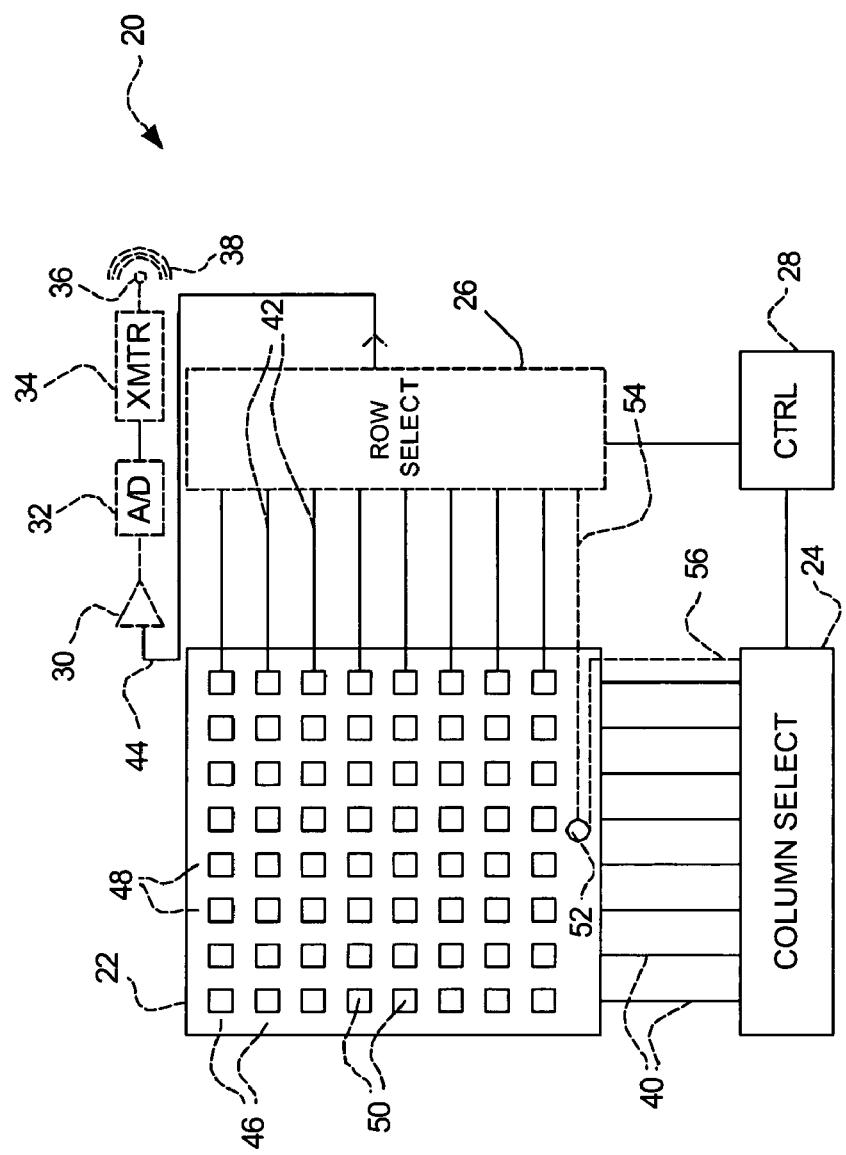
FIG. 1 is a schematic view of a radiation sensing device having a plurality of radiation sensing detectors, a selector, and a transmitter.

FIG. 1 illustrates part of a system for sending and receiving radiation detector values including a transmitting system 20 having an array of radiation detectors 22 (which may be IR or other kinds, e.g., CCD), a column selector 24, a row selector 26, a controller 28, and an optional temperature sensor 52. Radiation detector array 22 includes numerous radiation detector elements 50 which, in a preferred embodiment, is an infrared sensing microbolometer. In many embodiments, detector array 22 is substantially planar and thus produces a distorted image when receiving a non-planar focal surface as may be generated by a single objective lens element. In particular, the received image may contain significant spherical aberration, and be degraded by a spatially varying point spread function (PSF). Radiation detectors 50, in the embodiment illustrated, are deployed in a series of columns 48 and rows 46.

In the embodiment illustrated in FIG. 1, controller 28 controls column selector 24 and row selector 26. Controller 28 can include a counter for stepping selectors 24 and 26 through a series of nested row and column addressing sequences. Column selector 24 can select or address radiation detectors 50 through a series of column addressing lines 40. Row selector 26 can address or select radiation detectors 50 on a row-by-row basis. In one embodiment, a single radiation detector is addressed or selected for a reading at any instant in time by the selection of a single column selector line 40 and a single row selector line 42. In another embodiment, all detectors in a column are addressed or selected for reading simultaneously, by the selection of a single column and accepting all row signals into row selector 26, after which individual detector signals are passed out sequentially to the amplifier 30. Preferably, the array of radiation detectors 22, the column selector 24, the row selector 26, the controller 28, and the optional temperature sensor 52 are all part of a microbolometer device and are all formed on the same substrate. In a preferred embodiment, a 160 by 120 (160×120) array of 35-micrometer sized microbolometers is used to form the microbolometer array.

It is contemplated that detector offset signals may be applied directly to the array of radiation detectors, so as to partially compensate the individual radiation detectors for zero offsets. Such non-uniformity correction is disclosed in U.S. Pat. No. 4,752,694. With particular readout circuits described in this invention, offset correction circuits similar to those in U.S. Pat. No. 4,752,694 may be used, or other offset correction circuits well known to persons skilled in the electronic arts may be employed, as in U.S. Pat. No. 5,811,808.

When a particular detector 50 signal is passed to a readout line 44, that signal corresponds to the radiation intensity striking the selected radiation detector 50, which can be amplified by an amplifier 30, which can be coupled to an analog-to-digital converter 32, which can, in turn, be coupled to a transmitter 34. In the embodiment illustrated, transmitter 34 is coupled to an antenna 36 for emitting wireless signals 38. In one embodiment, signals 38 are radio frequency signals transmitted without wires, while another embodiment utilizes optical wireless transmissions, which can include infrared signals. Signals 38 can also be transmitted over electrical wires or optical fibers.

In one embodiment, temperature sensor 52 can be selected or addressed by a temperature sensor selector line 56, with the temperature sensor value being read out by a temperature sensor readout line 54 which may be coupled to radiation detector readout line 44. In one embodiment, the temperature sensor value is added as an additional value at the beginning or the end of a series of transmitted radiation detector values.

Figure 2:
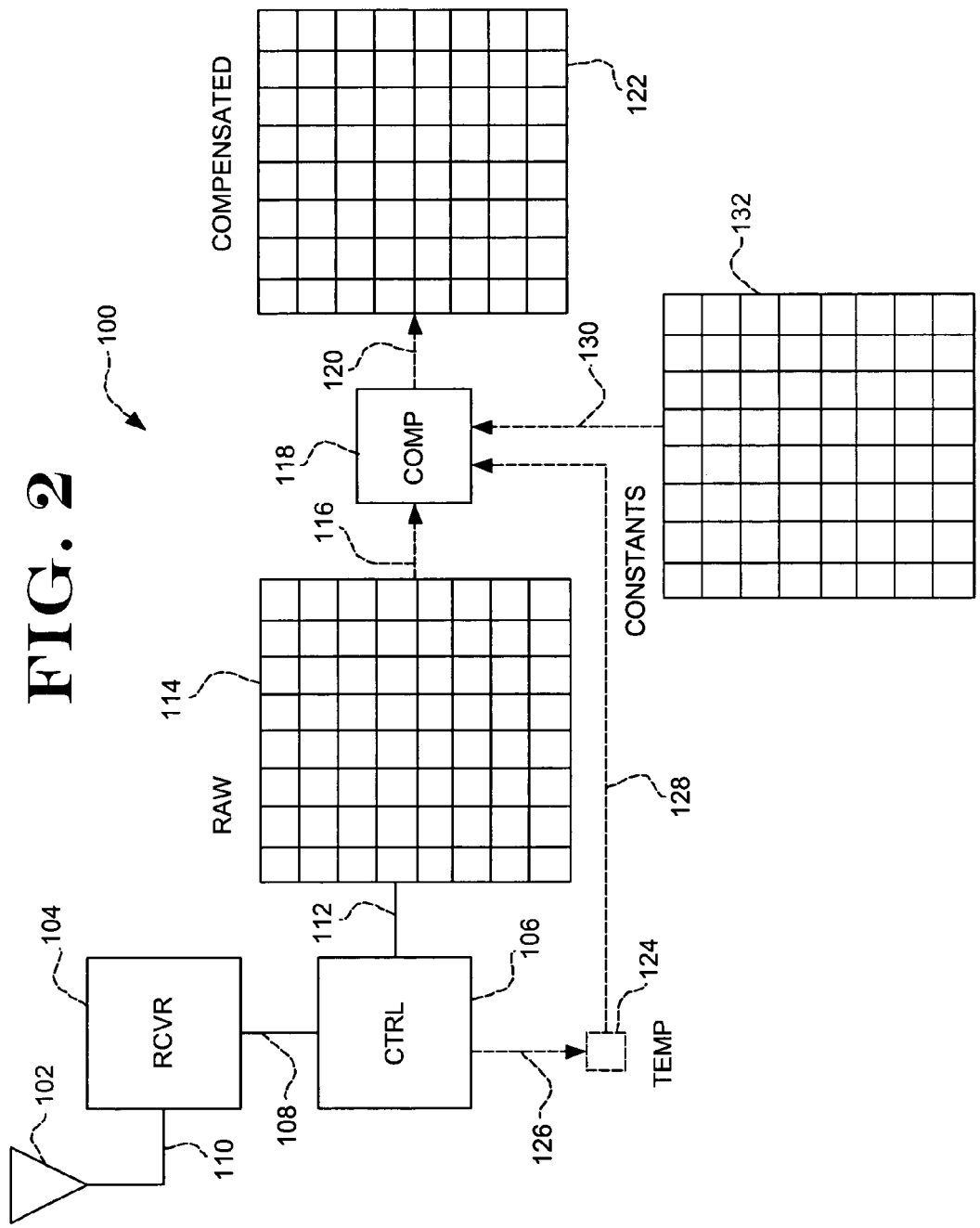
FIG. 2 is a receiving system for receiving transmitted signal values including a temperature compensator for compensating raw, received signal values from a system as in FIG. 1, the compensator using values which vary with array temperature, and which are typically different for each sensing detector.

Referring now to FIG. 2, a remote station or receiving system 100 is illustrated for receiving a series of transmitted radiation detector values and array temperature signals from the camera 20 of FIG. 1. Receiving system 100 can include an antenna 102 coupled to a receiver 104 through line 110, with receiver 104 being coupled to a controller 106 though a line 108. Controller 106 can provide a raw data structure, array or device 114 with a plurality of raw radiation detector data values through a line 112. Storage device array 114 can be any device capable of storing the plurality of radiation detector values obtained from the transmitting system. The raw values can be fed to a compensator 118 through a connecting line 116. In the embodiment illustrated in FIG. 2, a series of constants, such as zeroing amplification constants, may be stored in a data structure, array or device 132 and provided to comparator 118 through a connecting line 130.

In some embodiments, a temperature value is received from the transmitting system and stored in a temperature storage location 124, either as a temperature or a raw detector output value. Temperature storage location 124 can be supplied by controller 106 which can retrieve the temperature value from the stream of received radiation detector values and supplied to temperature storage location 124 through line 126. The temperature value can be retrieved by compensator 118 through line 128. In one embodiment, compensator 118 takes the raw radiation detector signal values 114, the temperature values stored in device 124 and the constants stored in device 132, and compensates the raw radiation detector signal values both for inter-detector differences and for the array ambient temperature, providing a series of compensated values which can be stored in a compensated storage data structure, device, or array 122 through line 120.

In one embodiment, detector array 22 of FIG. 1 is tested at the factory to measure differences from detector to detector. In particular, in one embodiment, the output values of each detector at a baseline of zero (0) received radiation, is stored in a table such as constant array 132 of FIG. 2, plus a number of array temperatures. The constants stored in array 132 can be used to adjust the values received from each detector 50 of FIG. 1 to effectively zero the values received by receiver 104 and stored in raw value array 114.

In one embodiment, a single temperature compensation model is stored and used by compensator 118 to adjust the received values of all detectors in raw array 114 according to the onboard temperature of detector array 22. In another embodiment, a separate model is provided for each detector across array temperatures. In this embodiment, the temperature dependence of each detector 50 of FIG. 1 can be measured at the factory or at some time prior to deployment of transmitting system 20.

In one embodiment, the temperature dependence of each detector 50 is independently stored, for example, by storing a different set of temperature coefficients in constant storage array 132. In another embodiment, optional temperature storage location 124 is not provided, and the compensation performed by compensator 118 eliminates only the inter-detector differences. In one embodiment, controller 106 can retrieve the data received at a particular location in the received data stream, thus isolating the onboard temperature sensor value. In another embodiment, the temperature sensor value may be effectively marked by a bit or a particular series of bits to identify the temperature sensor value as a temperature value, rather than a received radiation intensity value.

Figure 3:
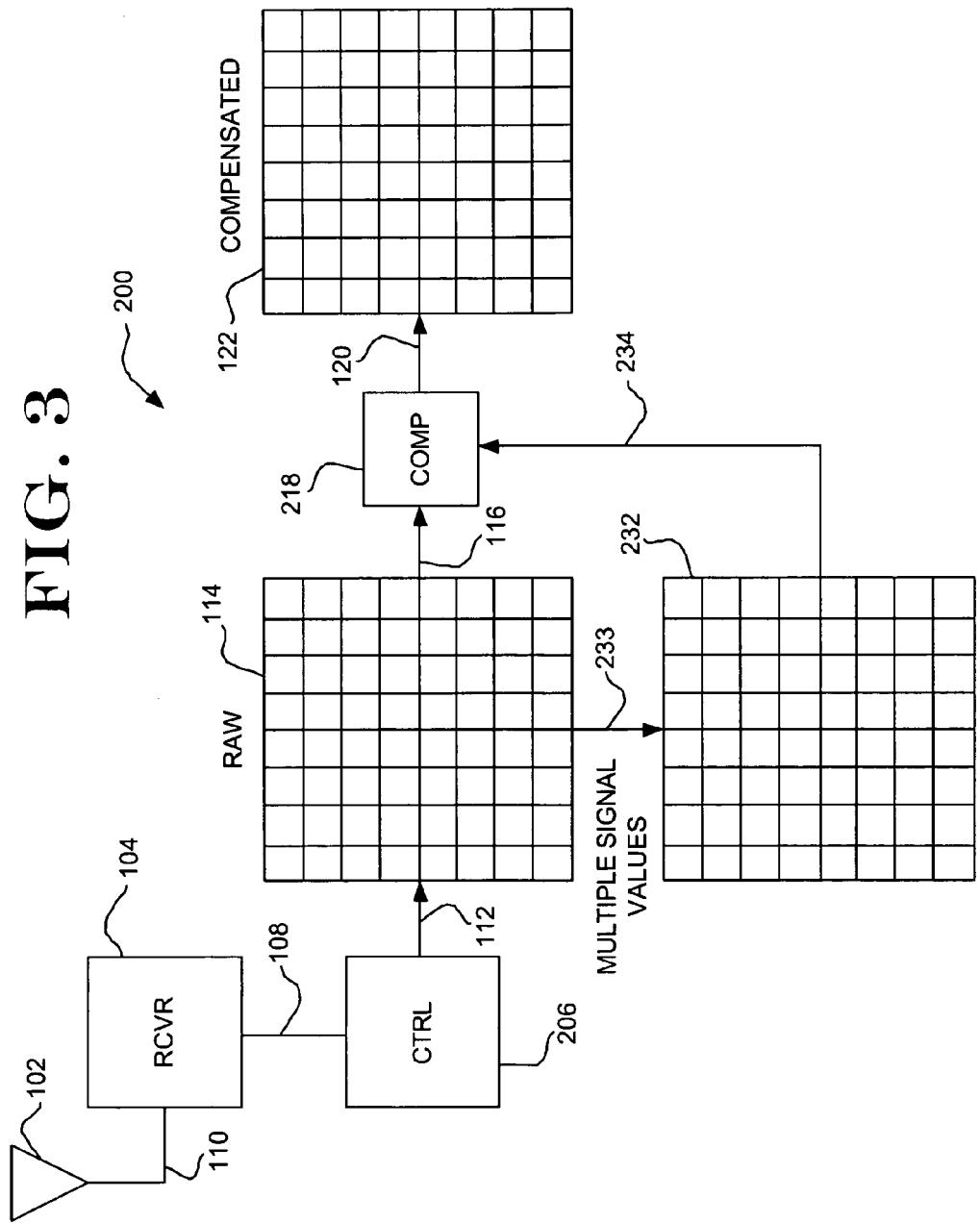
FIG. 3 is a schematic view of a receiving system for receiving transmitted radiation signal values from a system as in FIG. 1, including a compensator using multiple signal values to compensate for inter-detector differences.

Referring now to FIG. 3, another receiving system 200 is illustrated which can be used to receive transmitted radiation detector signal values as transmitted by transmitting system 20 of FIG. 1. Receiving system 200 includes many of the same components previously described and identically numbered in FIG. 2, which are not discussed further. Receiving system 200 includes a controller 206 for processing received signals through input line 108, and outputting raw detector data values into raw detector storage device 114. In this embodiment, the raw detector values can be stored over time on a detector-by-detector basis, providing multiple signal values for each detector through input line 233. The signal values, averaged over time, should be substantially identical for all detectors 50, if the target is similarly identical. However, due to the inter-detector differences, detectors which received essentially identical cumulative radiation, will nonetheless output slightly different radiation signal values due to the inter-detector differences. These differences, or the cumulative values, may be stored in time average data structure or array 232.

In one embodiment, the average signal values over time can be used to effectively normalize the detector values. In another embodiment, time average array 232 stores the positive or negative number required to bring the detector value to the average over time. In this embodiment, a compensator 218 can obtain the raw data values through input line 116 and the time average values through line 234, producing a compensated array of values stored in compensated data array 122. In one embodiment, the raw detector values are compensated for inter-detector differences using time average values and a received onboard temperature measurement, such as illustrated in FIG. 2. In this embodiment, a temperature correction model may be performed by compensator 218, as discussed with respect to FIG. 2. In one embodiment, such as shown in FIGS. 2 and 3, if a camera lens is employed which produces a known image blurring, the compensators 118 and 218 may be used to remove the image blur to an acceptable degree.

Referring again to FIGS. 2 and 3, in one embodiment, the temperature compensation and inter-detector compensation can be performed by a general-purpose computer executing software operating upon the received detector data. In one embodiment, the data is received through input line 108, separated into raw data and, optionally, temperature data, and stored into arrays or other data structures within a general-purpose computer operating a computer program. In this embodiment, the general-purpose computer running the program can retrieve the needed constants and raw data, from data stores such as arrays. The retrieved data can be compensated within a compensating portion of the program, and output to a data storage area containing the compensated detector values. In a similar manner, with respect to FIG. 3, the time averaged values stored in array 232 of FIG. 3 can be averaged within a general-purpose computer executing a computer program. In one embodiment, the detector selector or selecting functions, as well as the controlling functions, are performed by a single processor.

Figure 4:
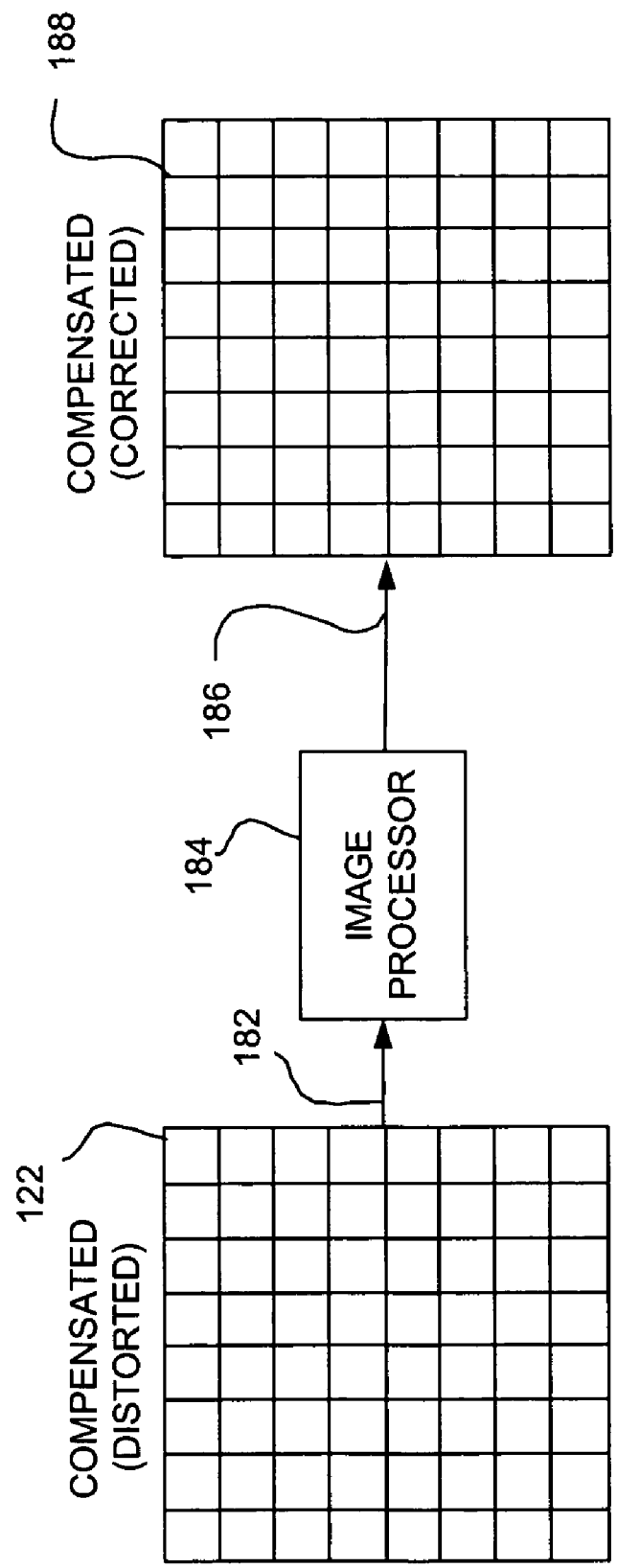
FIG. 4 is a schematic view of an image processing system for processing a distorted image received from a system as in FIGS. 2 or 3, including an image processor for executing image correction software.

Referring now to FIG. 4, a temperature compensated but distorted image 122 is illustrated. Distorted image 122 is retrieved through line 182 by an image processor 184 in the remote station. After processing the distorted image, a corrected image 188 may be provided through line 186 and stored, further processed, or further transmitted. The image processor function 184 can be provided by a general-purpose computer executing software operating upon the received, distorted image data. The data can be stored into arrays or other data structures within a general-purpose computer operating a computer program. In one embodiment, the image processing may be performed by a single processor.

The received image may be distorted because of a reduced quality lens system. Such a reduced quality lens system may include less expensive lenses, fewer lenses or both. One common distortion produced by a reduced quality lens system is a spatially varying point spread function (PSF). The PSF's first zero crossing radius may vary by an order of magnitude from the center of the image out to the borders of the field of view. The image provided may also contain blur caused by forward motion of the camera, as may be the case when the camera is carried by a micro air vehicle (MAV). In one example, if the instantaneous field of view (IFOV) of the imaging system is 0.25 degrees, or a six-inch pixel foot print at an altitude of about 100 feet, the forward motion may impart a 2-3 pixel blur to the image for a 30 Hz frame rate and a forward velocity of 25 miles per hour. The effect of the forward translation blur can be characterized if the ground speed of the camera is known. The blur can be reduced or removed by the image processor using the known or estimated ground speed.

One embodiment of the present invention uses a maximum likelihood estimation algorithm when removing distortion or blur from an image. A Maximum Entropy Method (MEM) may also be used. A preferred embodiment of the invention utilizes a Massively Parallel Richardson-Lucy (MPRL) algorithm. Such algorithms are well known to those skilled in the art. The MPRL source code is distributed by the NASA Jet propulsion Laboratory (JPL) at no cost. Other suitable image processing software is commercially available. One illustrative product is the "Image Scientist" product available from D&M Electronics, Cincinnati, Ohio.

As can be seen from inspection of FIGS. 1-4, the bulk or all of the processing may be performed in the receiving station, rather than in the transmitting station. In particular, the temperature compensation and inter-detector or inter-pixel compensation or normalization, and image de-blurring can be performed at the receiving end, for example, at a ground station. In this way, a lightweight, sometimes airborne, infrared camera can have the temperature compensation and image processing offloaded to the ground station, and a reduced quality lens system may be used.

Figure 5:
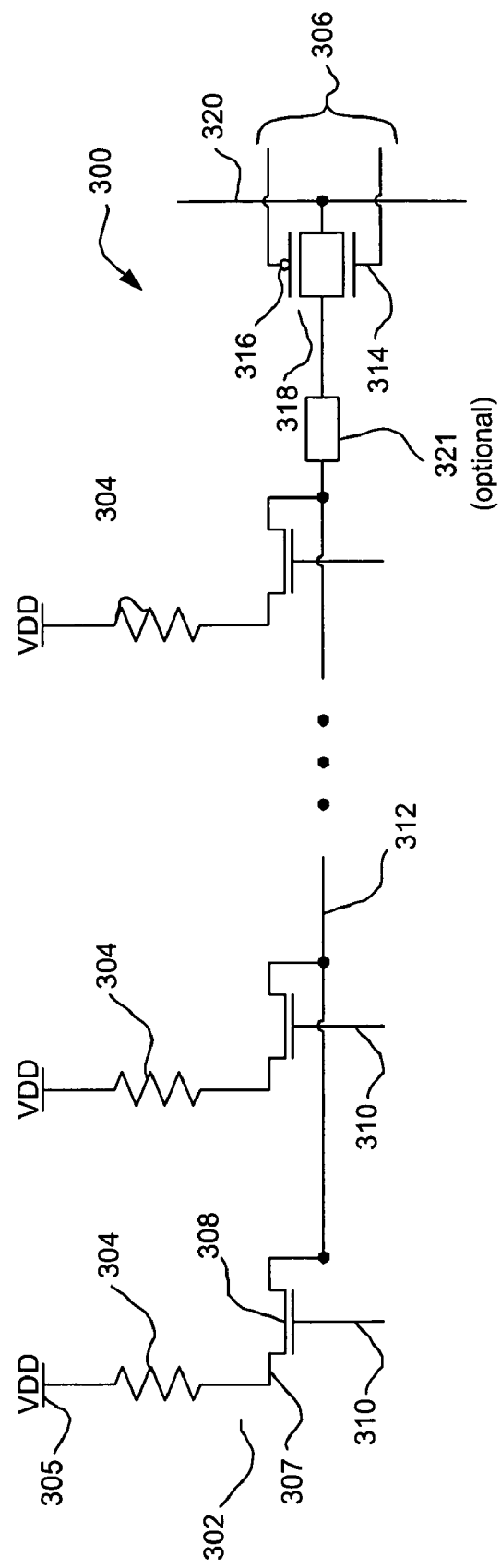
FIG. 5 is a schematic view of a row of infrared detectors and sampling circuitry which is used in one embodiment of the radiation sensing device of FIG. 1.

Referring now to FIG. 5, a single row of detectors 300 with readout is illustrated. Detector row 302 can include infrared sensitive variable resistance elements 304 which are supplied with a reference voltage at 305 providing a variable current therethrough at 307. Each resistance element 304 can be selected or addressed by a row selector circuit 306 and a column selector line 310. When the corresponding row and column are selected, the selected detector element 304 may be read.

In the embodiment illustrated in FIG. 5, an n-type transistor 308 is switched by the proper selection of a row line 312 and a column line 310. In the embodiment illustrated, row selector circuit 306 includes a transmission gate 318 which includes a p-type transistor 316 and an n-type transistor 314. When the reading of a row is desired, only one column addressing line 310 and one row readout line 312 are typically selected. The current thus flows from junction 307 through gate 308 and readout line 312, and out a common readout line 320. In another embodiment, in which all detectors in a column are addressed or selected for reading simultaneously by the selection of a single column, an optional integrator 321 is provided for each row within the row selector, and means 314 for passing individual detector signals out sequentially to the amplifier 30.

Figure 6:
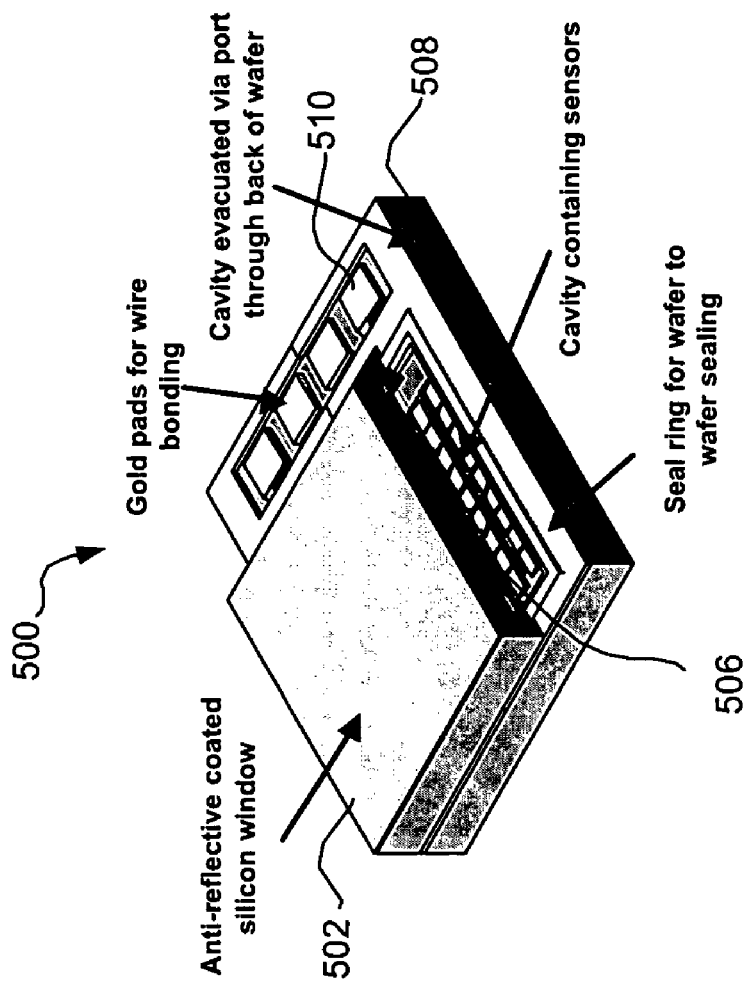
FIG. 6 is a cutaway, perspective view of an integral vacuum package including an infrared transparent silicon top cap providing a vacuum environment for a bolometer array.

Referring now to FIG. 6, an integral vacuum package (IVP) 500 suitable for use with the current invention is illustrated. IVP 500 preferably includes an infrared transparent silicon top cap 502. The silicon top cap 502 is preferably micromachined to include a cavity that is in registration with the microbolometer detector elements 508. The silicon top cap 502 is bonded to the substrate of the microbolometer array 508 to provide a vacuum environment for microbolometer detector elements 506. The bonding is typically performed on a wafer scale.

In a preferred embodiment, the silicon top cap 502 is provided with vias so that it does not extend over the bonding pads 510 of the microbolometer. Configured in this way, the IVP 500 may be directly bonded to a ceramic motherboard 528, with wire bonds, bump bonds or other bonding mechanisms used to directly connect the bonding pads 510 of the microbolometer to bond pads on the ceramic motherboard 528. This is known as "hybridizing" the IVP 500 with the ceramic motherboard 528, as better shown in FIG. 6. This may eliminate the need for a conventional chip carrier, which may reduce the weight of the camera.

It is also contemplated that any supporting electronics in the camera, such as A/D converters and/or transmitting circuitry, may be hybridized with the ceramic motherboard 528. That is, rather than including the supporting electronics in conventional packages, the integrated circuit dice 530 of the supporting electronics may be directly bonded to the ceramic motherboard 528, with wire bonds, bump bonds or the like connecting the supporting electronics to the ceramic motherboard 528. This may also reduce the weight of the camera.

Figure 7A:
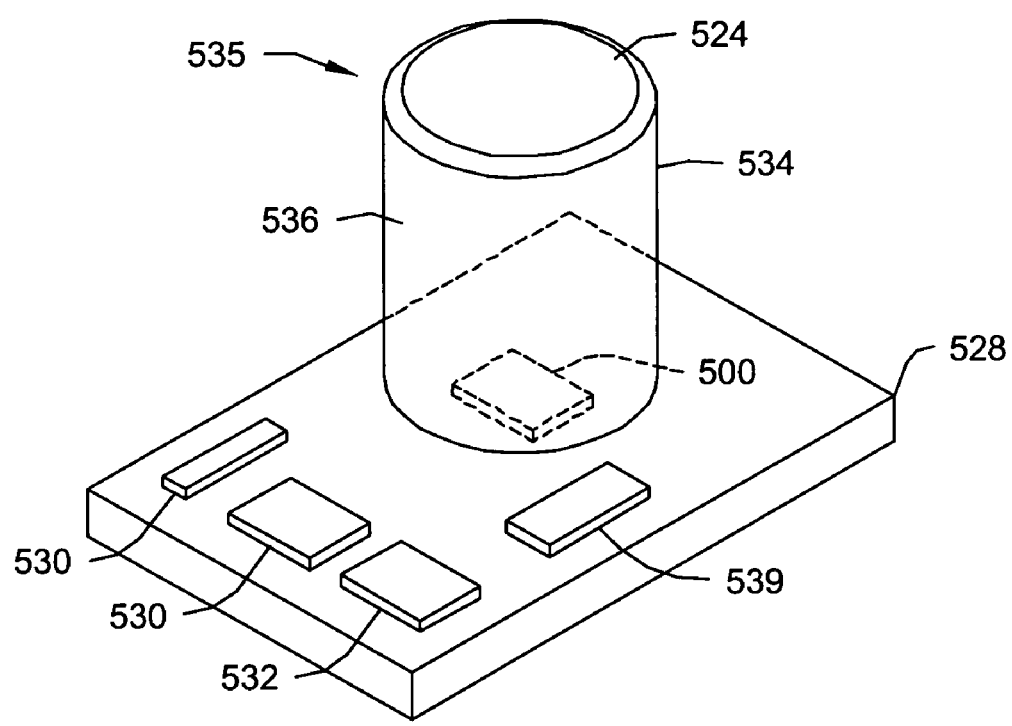

Referring now to FIG. 7, IVP 500 is shown included in a camera system 520. The illustrative camera system 520 includes a germanium singlet lens system 522. The single germanium lens element 524 is preferably a low cost lens that is held in place by multiple titanium spacer legs 526 mounted on a ceramic motherboard 528. Lens 524 may be an aspheric lens rather than a conventional spheric lens which has a lens curve on its surface that is part of a sphere which is not characteristic of an aspheric lens. The aspheric lens may have a complex curve permitting the aspheric lens to be significantly less distorting than its spheric counterpart. A spheric lens system also may require three lenses for appropriate focusing of an image (with insignificant non-planar distortion) on a receptor such as the microbolometer or other kind of detector array in IVP 500. Distortion of primary concern may be that of a nonplanar focal plane. An aspheric lens system may require only two lenses for appropriate focusing of the same distortionless quality as that of the three spheric lens system on a receptor of an image through the lens system. Each lens element 524 may be instead made of another suitable material. The legs 526 may be of some other suitable metal or material. FIG. 7a reveals another illustrative camera system 535 having an aluminum cylinder or tube 534 that contains a lens system 536 that includes the singlet lens element 524. Tube 534 may be made another appropriate metal or material. Lens 524 support may be another kind of structure. IVP 500 preferably has a substantially flat, planar, detector array. Tube 534 may be situated on ceramic motherboard 528. The single germanium lens element 524, being of relatively low quality, may have a substantially curved focal plane, and may thus produce a distorted image at the microbolometer detector array in the IVP 500. This distorted image is preferably captured by the microbolometer array in the IVP 500, and subsequently transmitted to a remote ground station. The remote ground station may then perform image processing to reduce or remove the distortions or blurring in the image, primarily due to a curved focal plane, as discussed above.

Figure 8A:
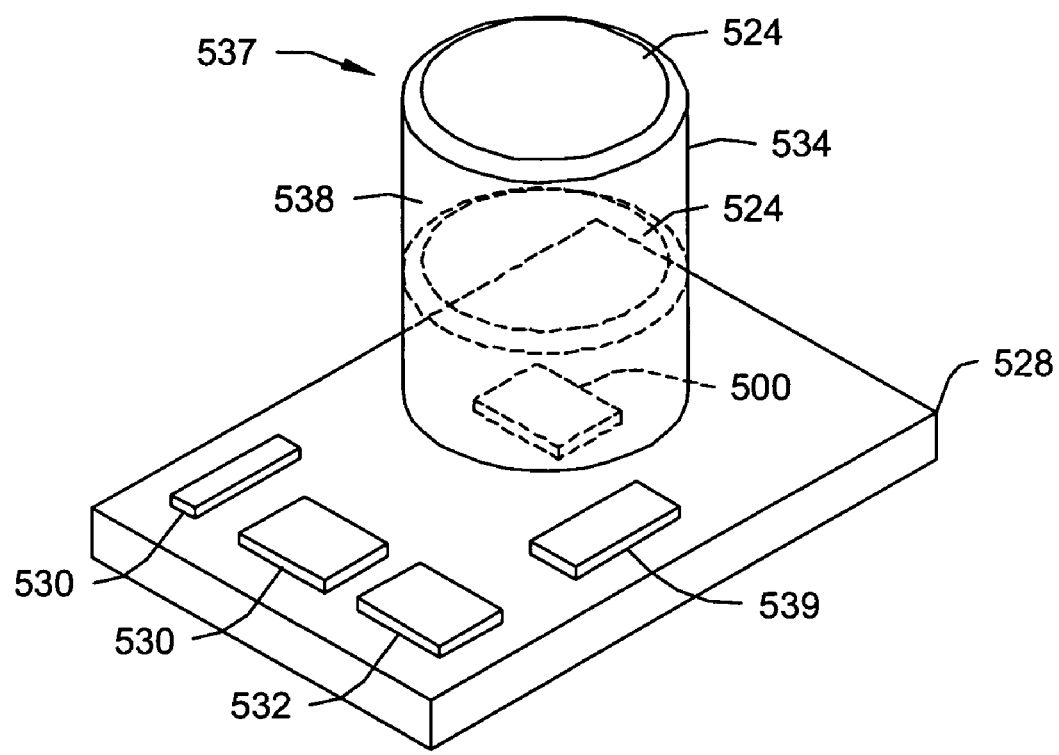

FIG. 8 illustrates a camera system 521 that may have a germanium doublet lens system 523. The two germanium lens elements 524 may be held in place by multiple titanium spacer legs 526 mounted on ceramic motherboard 528. The lens element 524 may be instead made of another light, durable and suitable material. The legs 526 may be of some other suitable metal or material. FIG. 8a reveals another illustrative camera system 537 having an aluminum tube 534 that contains a doublet lens system 538 that includes the lens elements 524. Tube 534 may be another appropriate metal or material. Camera systems 521 and 537 may be similar in other respects to camera systems 520 and 535 illustrated in FIGS. 7 and 7a. Using two lens elements, however, may reduce the distortion or blurring in the image that is presented to the microbolometer array, at least in comparison to the single lens systems of FIGS. 7 and 7a. Thus, the amount of image distortion reduction processing required at the ground station may be reduced or even eliminated with the doublet aspheric lens system.

As can be seen from inspection of FIGS. 7, 7a, 8 and 8a, cameras 520, 521, 535 and 537 do not require a shutter or temperature stabilizer, as these add weight. The transmitter may be included on the ceramic motherboard 528, for example, at least in part by integrated circuit 532. Of the camera systems 520, 535, 521 and 537, with appropriate housing, each preferably weighs less than 15 grams with a doublet lens, and more preferably less than about 10 grams. (One ounce=28.35 grams.) In some embodiments, as previously discussed, a temperature sensor, for example, an RTD sensor, is bonded to ceramic motherboard 528, and can be included in IVP package 500. The preferred lack of shutter or chopper, temperature stabilizer, complex onboard processing, and reduced lens system may each contribute to an extremely lightweight infrared camera.

Figure 9:
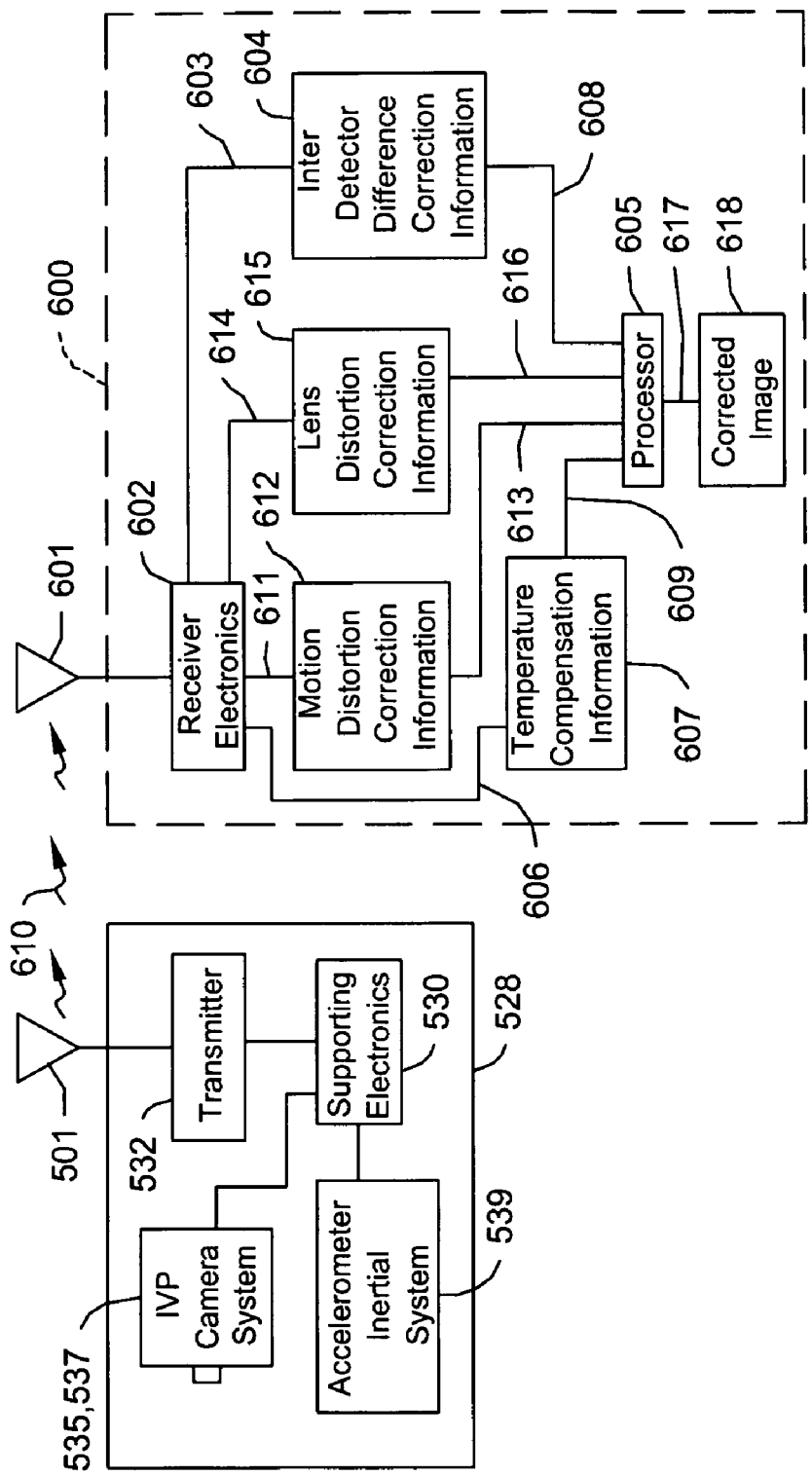
FIG. 9 is a schematic of a camera system having a motion sensor for determining and correcting motion distortion.

FIG. 9 is a diagram that includes a lightweight IVP camera system 535, 537 along with a motion detection or inertial system 539, transmitter 532 and supporting electronics 530. Receiver system 600 has an antenna 601 for receiving wireless signals 610 from antenna 501 of transmitter 532. In the case of a person, e.g., soldier or doctor wearing camera system on the head and having receiving system 600 at another location, e.g., around the waist, the transmitter output of antenna 501 may instead be wired, or acoustically or optically conveyed to receiving system 600. Other media may be incorporated for such information transfer. In the case where camera system 535, 537 is on a MAV, transmitter 532 on motherboard 528 may have its functions performed by a transmitter on board of the MAV. Henceforth, reference to camera system 535 may also include reference to system 537 and vice versa.

Camera system 535 may output image signals of a sensed image in the form of pixel information which may be outputs of detectors of a microbolometer or other kind of an array in IVP 500. This output may be fed to supporting electronics 530. Also temperature data of the detector array may be output to electronics 530. Supporting electronics 530 may convert the detector and temperature information, if in analog form, to a digital format. That output may go to the transmitter for conversion to signals for transmission.

Motion detection of camera system 535 may be provided by an accelerator inertial system 539. System 539 may have three accelerometers positioned to sense acceleration in three directions perpendicular to one another, viz., x, y and z directions. Micro electromechanical machined system (MEMS) silicon accelerometers of significant precision are available. The total weight of a set of three such accelerometers, including supporting electronics, may be less than 2 grams. The accelerators not only can provide acceleration and direction of acceleration but also can, with a portion of supporting electronics 530, provide speed and distance traveled by integration the acceleration over time. For instance, if one knows how fast the camera is accelerating over time, then one can determine how much its speed has changed over that time period. So, if the camera starts from zero speed, then one may know what its speed is at each time period after the start. These time periods may be broken into small periods (e.g., 1 millisecond) by the supporting electronics. Distance may be measured in the same fashion. If one knows how fast the camera is going for a certain period of time, then one may know the distance traveled by the camera over that period of time. Accelerometer information can also indicate complex motion, including a combination of rotation and linear motion of dynamically changing direction. Motion detection may be determined with other inertial types of devices. Further, the camera system may use the accelerator information of an on board inertial system of, for example, the MAV where the camera system is situated. The information in the form of signals from the motion or accelerometer inertial detection system may be sent to supporting electronics 530 to be processed as noted above and possibly be converted into digital signals if desired for transmission via transmitter 532 to receiving system 600. The whole transmitting system, including IVP camera system 535, accelerator system 539, supporting electronics 530, transmitter 532 and antenna 501, including motherboard 528 that these items are mounted or formed on, may weigh less than 15 grams.

Receiver electronics may receive and amplify signals 610 from transmitter 532 for possible conversion from a digital format if sent as such or vice versa. Image detector signals 603, possibly including inter-detector differences, may proceed from receiving electronics to inter-detector difference correction information module 604. Here, information 608 in the form of tables and/or algorithms, or other form, may be provided for eliminating the inter-detector differences. This difference elimination may be achieved as noted above or in known ways in the art. This information may be sent to processor 605 for removing these errors from the sensed image of camera system 535.

Temperature information 606, e.g., the temperature of IVP array 500, may be sent from receiver electronics 602 to temperature compensation information module 607 which may have corrective information in the form of tables and/or algorithms, or other form. Temperature compensating information 609 may be sent to processor 605 where the outputs of each of the camera system 535 detectors may be compensated individually or as a group for a given temperature and its changes. The compensation may be performed as described above or in known ways of the art. Processor 605 may thereby remove temperature related errors from the sensed image from camera system 535.

Motion information 611 of camera system 535 may be sent from receiving electronics 602 to motion distortion correction information module 612. Module 612 may have motion corrective information in the form of tables and/or algorithms, or other form. Motion compensating information 613 may be sent to processor 605 where the outputs of each of the camera system 535 detectors may be compensated individually or as a group for given motions and its changes. The compensation may be performed as described above or in known ways of the art. Processor 605 may thereby remove motion related errors from the sensed image of camera system 535.

Lens distortion information 614 of camera system 535 may be sent from receiving electronics 602 to lens distortion correction information module 615. Lens distortion may be the result of a non-planar focal plane, and/or aberrations and defects in lens or lenses 524. Specifically, camera system 537, which may have a doublet lens system 538, may have no or insignificant lens distortion and thus no need for lens distortion correction of the image transmitted from system 537. However, camera system 535, specifically having a singlet lens system 536, may need lens distortion correction. For this case, module 615 may have motion corrective information in the form of tables and/or algorithms, or other form. Lens compensating information 616 may be sent to processor 605 where the outputs of each of the camera system 535 detectors may be compensated individually or as a group for given motions and its changes. The compensation may be performed as described above or in known ways of the art. Processor 605 may thereby remove lens related errors from the sensed image of camera system 535.

Processor 605 may provide a rather completely corrected image output 617 of a sensed image originating in lightweight IVP camera system 535 or 537 weighing less than 15 grams including motherboard 528 with all of its hybridized components 530, 532 and 539. Corrected image 618 may thus be free from inter-detector difference distortion, temperature distortion, motion distortion and lens distortion.

A lightweight infrared camera, as can be provided by the present invention, can be used in any number of applications. In one illustrative application, a lightweight micro air vehicle (MAV) can be used with downloading capabilities to relay the infrared image of a selected area over an RF link to a ground station. In another illustrative application, an expendable, single use, lightweight infrared camera can be deployed through use of a downwardly drifting projectile slowed by a small chute to provide maximum time over the recognizance target. In yet another illustrative application, the present invention is incorporated into a helmet mounted detector device.

Numerous advantages of the invention covered by this document have been set forth in the foregoing description. It will be understood, however, that this disclosure is, in many respects, only illustrative. Changes may be made in details, particularly in matters of shape, size, and arrangement of parts without exceeding the scope of the invention. The invention's scope is, of course, defined in the language in which the appended claims are expressed.

What is claimed is:

1. A lightweight camera and system comprising:
    a camera comprising:
        at least one lens having a nonplanar focal plane;
        a substantially planar infrared detector array situated proximate to the nonplanar focal plane of said lens;
        a motion detector for detecting motion of the camera; and
        a transmitter connected to said detector array and said motion detector;
    a receiver for receiving wireless signals from said transmitter; and
    a processor connected to said receiver;
    wherein:
        an image detected by said detector has some nonplanar-to-planar focal plane distortion and said detector has some motion relative to a source of the image resulting in some forward translation of camera blur of the image detected by said detector array;
        said motion detector has an output providing an indication of an amount of forward translation of camera blur; and
        said processor reduces the distortion.

2. The camera and system of claim 1, wherein said processor reduces forward translation of camera blur of the image detected by said detector array.

3. The camera and system of claims 2, further comprising:
    a temperature sensor situated on said detector array and connected to said transmitter; and
    a model having temperature data for the detector array connected to said processor; and
    wherein a detector array temperature from said transmitter is adjusted according to temperature data of said model.

4. The camera and system of claim 3 wherein:
    said receiver receives individual detector values; and
    said processor normalizes the detector values when the individual detectors output different values for the same radiation detected.

5. The camera and system of claim 4, wherein said processor reduces the effects in the image caused by lens defects.

6. The camera and system of claim 5, wherein:
    said camera has a weight less than 15 grams; and
    said receiver is situated on the ground.

* * * * *